(12) United States Patent
Miki

(10) Patent No.: US 8,302,408 B2
(45) Date of Patent: Nov. 6, 2012

(54) TEMPERATURE CONTROL DEVICE FOR LIQUID MEDICINES

(75) Inventor: Hiroyuki Miki, Tsukubamirai (JP)

(73) Assignee: SMC Corporation, Tokyo (JP)

( * ) Notice: Subject to any disclaimer, the term of this patent is extended or adjusted under 35 U.S.C. 154(b) by 852 days.

(21) Appl. No.: 12/051,967

(22) Filed: Mar. 20, 2008

(65) Prior Publication Data

US 2008/0236805 A1    Oct. 2, 2008

(30) Foreign Application Priority Data

Mar. 30, 2007 (JP) ................. 2007-091489

(51) Int. Cl.
  *F25B 21/02* (2006.01)
(52) U.S. Cl. .......................................... 62/3.3
(58) Field of Classification Search ............. 62/3.3, 62/3.7; 165/170
  See application file for complete search history.

(56) References Cited

U.S. PATENT DOCUMENTS 6,446,442 B1 * 9/2002 Batchelor et al. ............... 62/3.3
6,666,031 B2 * 12/2003 Ohkubo et al. .................. 62/3.3

FOREIGN PATENT DOCUMENTS

| JP | 11-67717 | 3/1999 |
| JP | 11-067717 | * 3/1999 |
| JP | 2003-337626 | 11/2003 |

OTHER PUBLICATIONS

Shimizu Kenji, Translated JP 11-067717, Cooling/Heating Apparatrus for Semiconductor processing solution, Publication date: Mar. 1999.*
Japanese Office Action issued Feb. 28, 2012, in Japan Patent Application No. 2007-091489 (with English translation).

* cited by examiner

*Primary Examiner* — Frantz Jules
*Assistant Examiner* — Emmanuel Duke
(74) *Attorney, Agent, or Firm* — Oblon, Spivak, McClelland, Maier & Neustadt, L.L.P.

(57) ABSTRACT

In a temperature control device for liquid medicines provided with a flow path block having flow paths for liquid medicines at both of front and back surfaces, heat-transmitting plates respectively disposed at both of the front and back surfaces of the flow path block in a manner so as to face the flow paths, and thermo-modules for performing a cooling operation or a heating operation on the liquid medicines that flows through the flow path via the heat-transmitting plates, respectively, at least one ridge of mountain-shaped sealing projection portion surrounding a periphery of the flow path are integrally formed with the flow path block at sealing surfaces respectively surrounding the flow paths at both of the front and back surfaces of the flow path block, and the heat-transmitting plates are fixed to the flow path block in a state of pressure-contacting the sealing projection portion.

6 Claims, 5 Drawing Sheets

TEMPERATURE CONTROL DEVICE FOR LIQUID MEDICINES

TECHNICAL FIELD

The present invention relates to a temperature control device for liquid medicines used in a semiconductor-relating manufacture apparatus or the like, and more particularly, to a temperature control device for liquid medicines that performs a cooling operation or a heating operation on corrosive liquid medicines by contacting the corrosive liquid medicines for use in a semiconductor processing with a heat-transmitting plate where a thermo-module is in close contact therewith and fixed thereto.

BACKGROUND ART

In a semiconductor-relating manufacture apparatus or the like, a temperature control device for liquid medicines, which controls temperature of the corrosive liquid medicines used for a semiconductor processing by contacting the corrosive liquid medicines with a heat-transmitting plate where a thermo-module is in close contact therewith and fixed thereto, which is disclosed in, for example, Japanese Unexamined Patent Application Publication No. 11-67717 (patent document), is known. In the temperature control device for liquid medicines, a member that comes in contact with the liquid medicines is constructed with a fluorine resin having a good chemical resistance.

A construction of the temperature control device for liquid medicines described in the patent document is explained below using the reference numerals used in the patent document. A flow path (10) for the liquid medicine is formed at both of front and back surfaces of a flow path block (1) that is formed of a fluorine resin. A sealing portion (9) for sealing between a periphery of the flow path (10) and heat-transmitting plates (2a and 2b) is formed with a fluorine resin (21) having a C-shaped cross-section and an elastomer (20) having a rectangular cross-section that is enclosed in the fluorine resin (21). The sealing portion (9) is inserted into a circular groove formed at a periphery of the flow path (10) positioned at both of the front and back surfaces of the flow path block (1).

In this construction, it is required to seal two places, namely, a place between the fluorine resin (21) constructing the sealing portion (9) and the heat-transmitting plates (2a and 2b), and a place between the fluorine resin (21) and a groove bottom of the circular groove in the flow path block (1). Accordingly, there is a structural risk in which the liquid medicine might leak out unless the two places are simultaneously sealed by taking a device such as that a plurality of concentric projections (22) are respectively formed at a side of heat-transmitting plates (2a and 2b) of the fluorine resin (21) and a side of the groove bottom of the circular groove opposite thereto. As a result, the structure of the sealing portion (9) becomes complicated and thereby not only a manufacture cost of a heat exchanger increases but also the temperature control device for liquid medicines using the heat exchanger becomes expensive.

In addition, in a case that the sealing portion (9) of the flow path block (1) is constructed by means of separately inserting the fluorine resin (21) into the circular groove, a slight plastic deformation sometimes occurs in the flow path block (1) and the fluorine resin (21) of the sealing portion (9) due to a thermal deformation of the fluorine resin (21) caused along with a repetition of a cooling operation or a heating operation on the liquid medicine that flows through the flow path (10), and the fluorine resin (21) sometimes moves out of alignment in the circular groove. Thereby, it is also considerable that the projection (22) formed in the fluorine resin (21) is worn. Consequently, there is a possibility that a sealing characteristic of the sealing portion (9) cannot be secured.

DISCLOSURE OF INVENTION

Technical problems of the present invention are to aim at improving a sealing characteristic while simplifying a construction of a sealing surface in the periphery of a flow path for liquid medicines in a flow path block, and to reduce a manufacture cost of a temperature control device for liquid medicines by simplifying the construction thereof by means of decreasing the number of sealing places.

In order to solve the above-described technical problems, according to the present invention, a temperature control device for liquid medicines characterized in including a flow path block made of a chemical resistant resin, including groove-shaped flow paths where liquid medicines flow, at both of front and back surfaces thereof, heat-transmitting plates respectively disposed at both of the front and back surfaces of the flow path block so as to face the groove-shaped flow paths; and thermo-modules respectively disposed at outer surfaces of the heat-transmitting plates, and performing a cooling operation or a heating operation on the liquid medicines flowing through the groove-shaped flow paths via the heat-transmitting plates, in which at least one ridge of a sealing projection portion surrounding a periphery of each of the groove-shaped flow paths is integrally formed with the flow path block at sealing surfaces formed at both of the front and back surfaces of the flow path block, and in which the heat-transmitting plates are fixed to the flow path block in a state of pressure-contacting the sealing projection portions, respectively, is provided.

According to the present invention, preferably, a concave groove having a depth reaching a rear of the sealing projection portion is formed at an outer peripheral surface of the flow path block in a manner so as to surround the flow path block, and a sealing auxiliary member formed of a rubber-elastic material having a heat resistance and a chemical resistance for applying a pressurizing force to the sealing projection portion is fitted into the concave groove.

According to a concrete construction mode of the present invention, the flow path block is formed to have a rectangular shape, and the outer peripheral surface is formed to have four flat peripheral surface portions, in which the sealing projection portion is formed to have a rectangular frame shape and is formed to have four linear sealing edges respectively extending along the four peripheral surface portions in parallel, in which distances of each of the four linear sealing edges from each of the peripheral surface portions are equal to each other, and the depths of the concave grooves formed in the four peripheral surface portions are equal to each other.

Radiating plates for accelerating a heat release from the thermo-modules may be respectively disposed at the outer surfaces of the heat-transmitting plates disposed at both of the front and back surfaces of the flow path block while being in close contact with the thermo-modules, respectively.

According to a preferable construction mode of the present invention, the heat-transmitting plates are formed to have a larger dimension than a dimension of the flow path block, in which each of the two heat-transmitting plates at both sides of the flow path block is mutually coupled by means of coupling screws intersecting an outside of the flow path block, in which the flow path block is sandwiched between the heat-transmitting plates and fixed thereto by that the two heat-transmitting plates are tightened against each other by means of the coupling screws.

In this case, radiating plates for accelerating a heat release from the thermo-modules may be respectively disposed at the outer surfaces of the heat-transmitting plates disposed at both of the front and back surfaces of the flow path block while being in close contact with the thermo-modules, respectively, in which the thermo-modules may be respectively sandwiched between the radiating plates and the heat-transmitting plates and fixed thereto by means of the radiating plates being respectively fixed to the heat-transmitting plates with locking screws.

According to the above-described temperature control device for liquid medicines in accordance with the present invention, since the sealing projection portion for sealing between the flow path block and the heat-transmitting plate is integrally formed with the flow path block, compared to a heretofore known temperature control device for liquid medicines where the sealing projection portion is separately formed, a sealing characteristic can be aimed at improving while simplifying a construction of a sealing portion in the periphery of the sealing surface of the flow path block, and at the same time, the number of sealing places can be decreased. As a result, a manufacture cost can be reduced by simplifying the construction of the temperature control device for liquid medicines.

Further, a concave groove reaching a rear position of the sealing projection portion is formed at an outer peripheral surface of the flow path block, and a sealing auxiliary member formed of a rubber-elastic material having a heat resistance and a chemical resistance is fitted into the concave groove. Thereby, it becomes possible to suppress a plastic deformation of the sealing portion of the flow path block, occurring along with the cooling operation or the heating operation for the liquid medicines flowing through the flow path of a heat exchanger. As a result, the sealing characteristic of the sealing portion can further be improved.

BEST MODE FOR CARRYING OUT THE INVENTION

Hereinbelow, a best mode for carrying out a temperature control device for liquid medicines according to the present invention will be explained in detail with reference to the drawings.

Figure 1:
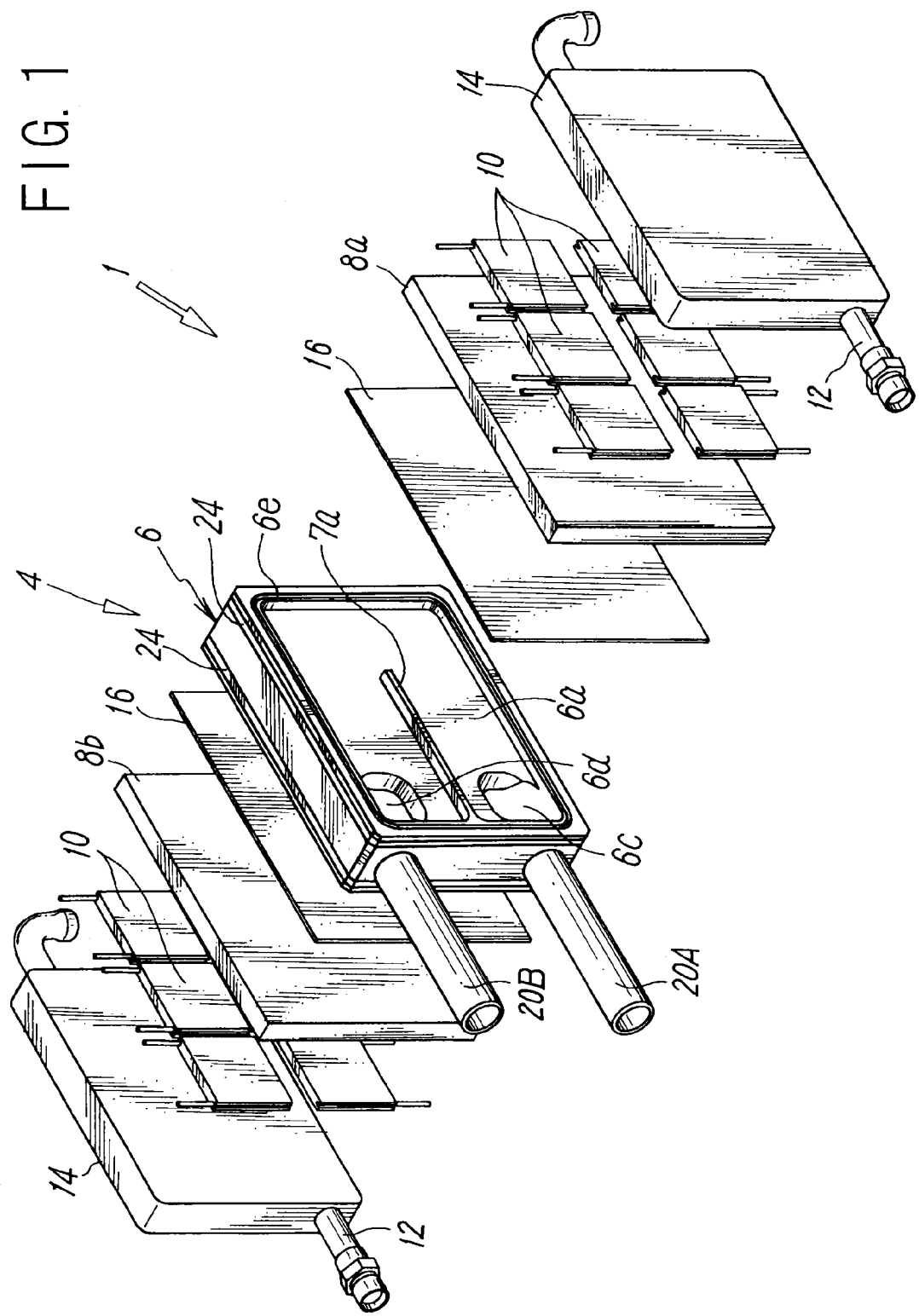
FIG. 1 is an exploded perspective view illustrating a fundamental construction of a temperature control device for liquid medicines according to the present invention in a state where a mechanism for combining each member is omitted.

FIG. 1 is an exploded perspective view illustrating a fundamental construction of an entire temperature control device for liquid medicines according to the present invention in a state where a mechanism for combining each member is omitted. A temperature control device 1 for liquid medicines is used for controlling temperature of a corrosive liquid medicine such as a semiconductor-processing liquid or the like in a semiconductor-relating manufacture apparatus or the like. The temperature control device 1 for liquid medicines is provided with a flow path block 6 made of chemical resistant resin (fluorine resin) having a rectangular block-shape, provided with groove-shaped flow paths 6a and 6b through which the liquid medicine flows, at both of front and back surface thereof, rectangular heat-transmitting plates 8a and 8b attached to both of the front and back surfaces of the flow path block 6 such that the heat-transmitting plates 8a and 8b face the flow paths 6a and 6b, respectively, thermo-modules 10 respectively disposed at outer surfaces of the heat-transmitting plates 8a and 8b, for cooling or heating the liquid medicine that flows through the flow path via the heat-transmitting plates 8a and 8b, and rectangular radiating plates 14 respectively disposed on the outer surfaces of the heat-transmitting plates 8a and 8b with the thermo-modules 10 therebetween, for accelerating a heat release from the thermo-module 10. The temperature control device 1 for liquid medicines is constructed by means of integrally combining each of the members with appropriate devices. The thermo-modules 10 are constructed with a plurality of peltiert devices.

Figure 3:
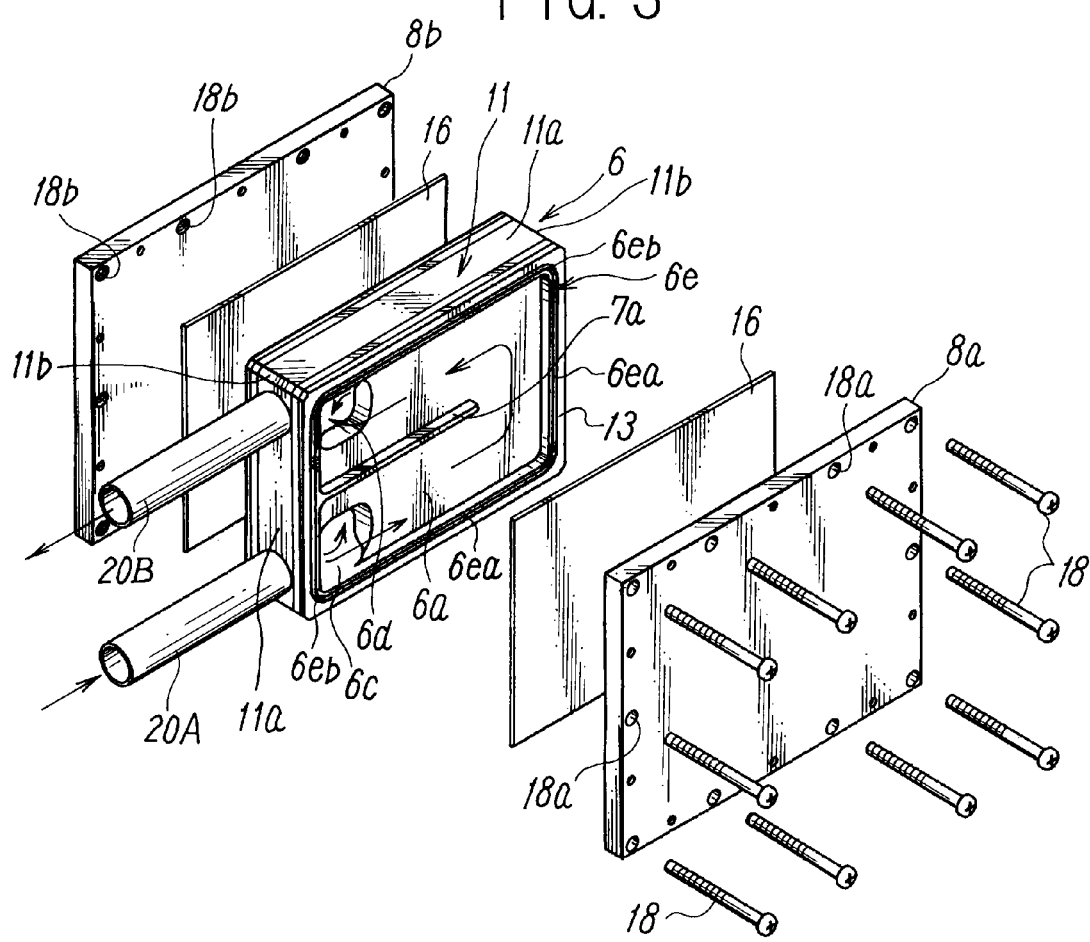
FIG. 3 is an exploded perspective view illustrating a heat exchanger constructing a part of the temperature control device for liquid medicines.
Figure 4:
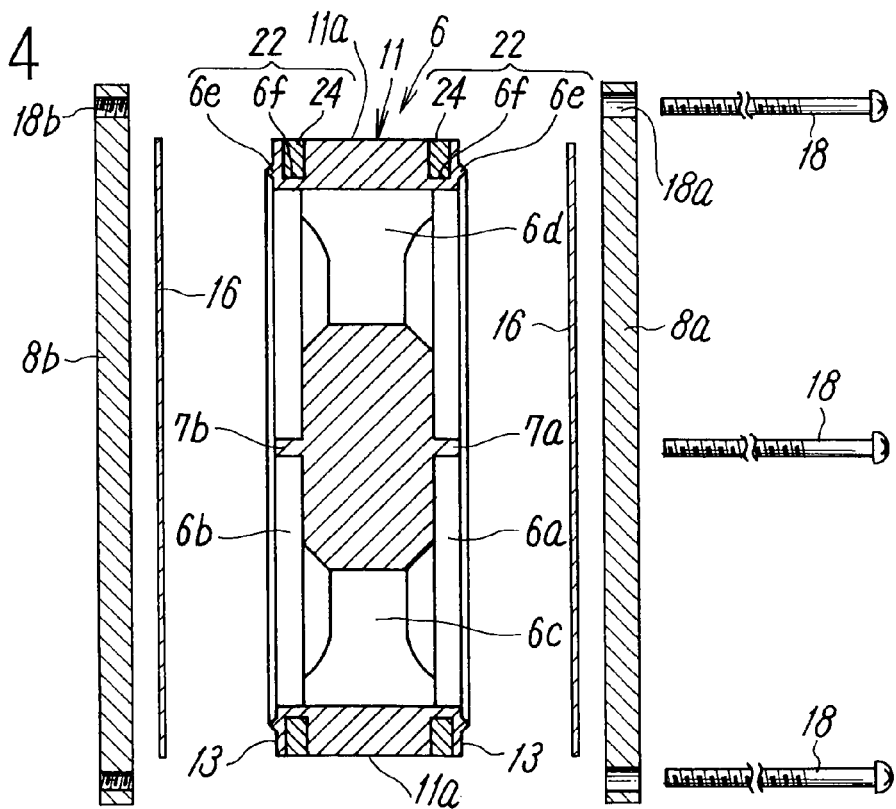
FIG. 4 is an enlarged cross-sectional view illustrating a cross-section of the heat exchanger of FIG. 3 at a position intersecting a flow-dividing chamber and an interflow chamber.
Figure 5:
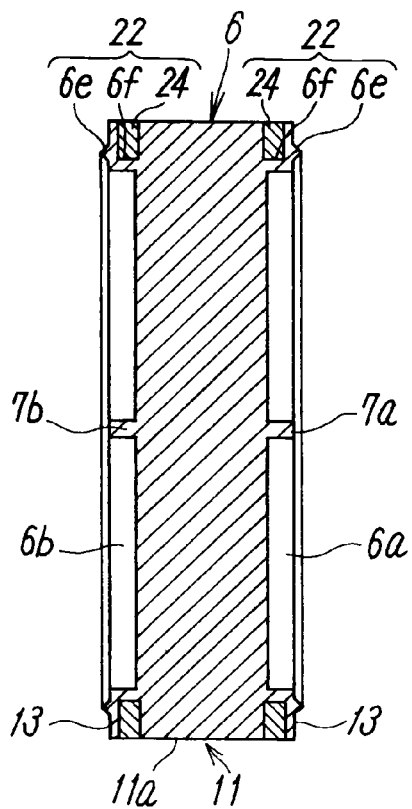
FIG. 5 is an enlarged cross-sectional view illustrating a cross-section of the heat exchanger of FIG. 3 at a position intersecting a flow path and a partitioning wall.
Figure 6:
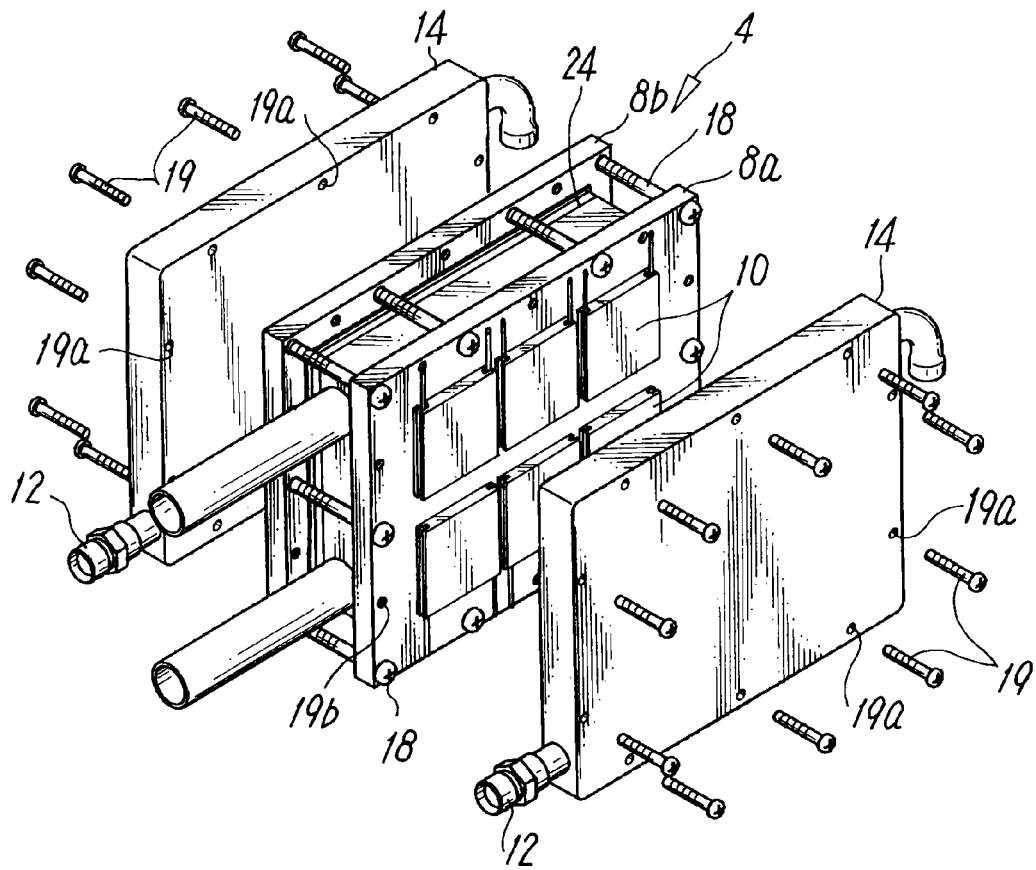
FIG. 6 is a perspective view illustrating a state of the temperature control device for liquid medicines of FIG. 2 where only the heat exchanger is assembled and a radiating plate is separated.
Figure 7:
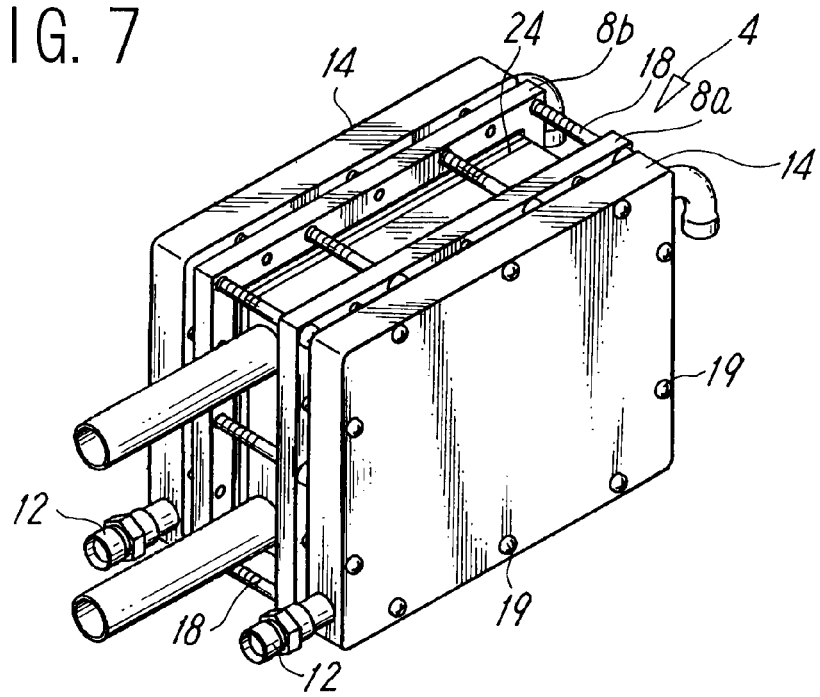
FIG. 7 is an exploded perspective view of a state where the temperature control device for liquid medicines of FIG. 2 is assembled.

As is clear from FIG. 3 and FIG. 6, the flow path block 6, the heat-transmitting plates 8a and 8b, and the thermo-modules 10 construct a heat exchanger 4 together with sheet members 16 respectively disposed between the flow path block 6 and the heat-transmitting plates 8a and 8b. The temperature control device 1 for liquid medicines is formed by disposing the radiating plates 14 at respective sides of the heat exchanger 4.

There are various methods for mutually combining the flow path block 6, the heat-transmitting plates 8a and 8b, the thermo-modules 10, and the radiating plates 14. As an example, the following method is considerable. In the method, an entire device is combined with a tie rod in the lump such that the two radiating plates 14 that are positioned at both ends of the temperature control device 1 are coupled with each other by means of the tie rod, and the two radiating plates 14 are mutually tightened by means of the tie rod. Thereby, the flow path block 6, the heat-transmitting plates 8a and 8b, and the thermo-modules 10 are sandwiched and fixed between these radiating plates 14.

Figure 2:
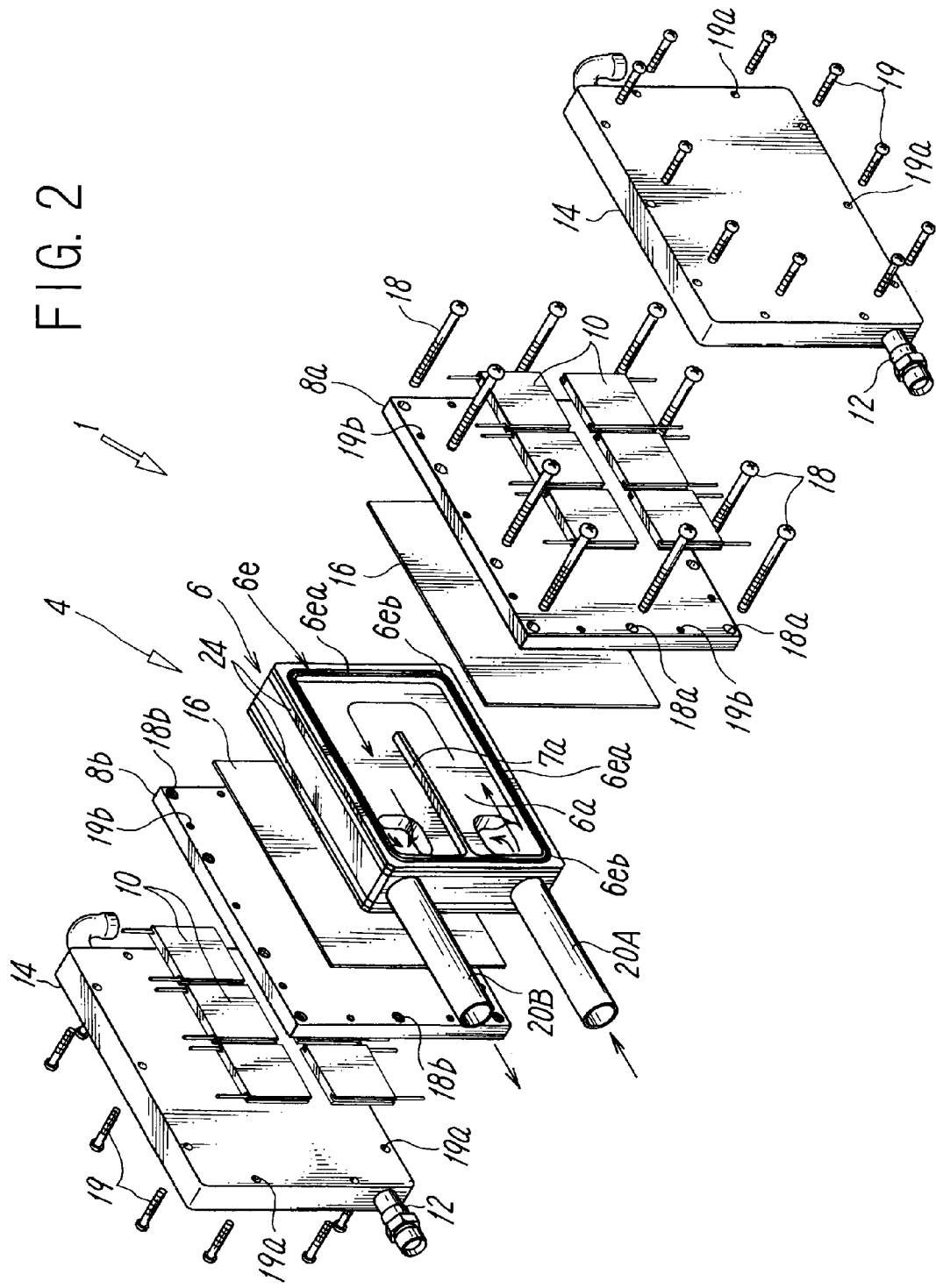
FIG. 2 is an exploded perspective view illustrating a concrete construction of the temperature control device for liquid medicines including the mechanism for combining the each member.

However, in this embodiment, as illustrated in FIG. 2, FIG. 3, and FIG. 6, the following method is used. In the method, the two heat-transmitting plates 8a and 8b that are positioned at both sides of the flow path block 6 are coupled with each other by means of a plurality of coupling screws 18 in a state where the flow path block 6 is sandwiched therebetween. Thereby, the heat exchanger 4 is formed of the flow path block 6 and the heat-transmitting plates 8a and 8b, and the radiating plates 14 are respectively fixed to the heat-transmitting plates 8a and 8b of the heat exchanger 4 with the thermo-modules 10 therebetween using locking screws 19.

Consequently, a construction of the temperature control device 1 will be explained more in detail on the basis of the embodiment illustrated in FIG. 2 through FIG. 7. The heat exchanger 4 constructing the temperature control device 1 is the one where the heat-transmitting plates 8a and 8b are respectively mounted on both of front and back surfaces of the flow path block 6 with the thin sheet members 16 formed of a fluorine resin similar to that of the flow path block 6 therebetween, as illustrated in FIG. 2 through FIG. 6. These heat-transmitting plates 8a and 8b are formed to have a larger dimension than that of the flow path block 6 in both of longitudinal and lateral directions, respectively. A plurality of screw-insertion holes 18a for inserting the coupling screws 18 are formed in a periphery of a first heat-transmitting plate 8a at one side, and a plurality of screw holes 18b for the coupling screws 18 to be screwed are formed in a periphery of a second heat-transmitting plate 8b at the other side. Further, these two of the first and second heat-transmitting plates 8a and 8b are coupled with each other by means of the coupling screws 18 extending in a manner so as to intersect an outside of the flow path block 6 and the sheet members 16, and are tightened by means of fastening these coupling screws 18. Thereby, the flow path block 6 and the sheet members 16 are sandwiched and fixed between these first and second heat-transmitting plates 8a and 8b.

Incidentally, both of these first and second heat-transmitting plates 8a and 8b may be coupled with each other by means of screwing the coupling screws 18, which are inserted into the screw insertion holes 18a in the first heat-transmitting plate 8a and the second heat-transmitting plate 8b, to nuts disposed outside the second heat-transmitting plate 8b, and fastening the coupling screws 18 to the nuts, while providing screw insertion holes 18a similar to that of the first heat-transmitting plate 8a instead of providing the screw holes 18b in the second heat-transmitting plate 8b.

Furthermore, the sheet members 16 may be omitted in a case that a surface of each of the first and second heat-transmitting plates 8a and 8b itself has a chemical resistance.

As the first and second heat-transmitting plates 8a and 8b, for example, a graphite substrate, a carbonized silicon substrate, a vitreous carbon substrate, or a composite substrate where an amorphous carbon layer or a carbonized silicon layer is provided on a liquid-medicine-contacting surface side of the graphite substrate may be used. Alternatively, the first and second heat-transmitting plates 8a and 8b may be formed with an aluminum plate, or may be formed by combining the aluminum plate and one of the above-described substrates. In a case that the aluminum plate and the above-described substrate are combined, although the substrate is disposed inside the aluminum plate in a laminated manner, the aluminum plate and the substrate may be combined into one piece or maintained in separated pieces. Moreover, in the case that the aluminum plate and the substrate are thus combined, preferably, the substrate is formed to have the same size as that of the flow path block 6, and the screw insertion holes 18a, the screw holes 18b, and screw holes 19b, described later, are formed in the aluminum plate having a larger size than that of the substrate.

Further, the sheet members 16 may be integrally formed with the liquid-medicine-contacting surface side of the first and second heat-transmitting plates 8a and 8b by means of bonding or heat-welding. In the case that the same is integrally formed, since the chemical resistance of the first and second heat-transmitting plates 8a and 8b against the liquid medicines can be increased, it becomes possible to prevent harmful impurities, such as a heavy metal ion or the like, from being eluted into the liquid medicines flowing through the flow paths 6a and 6b of the flow path block 6 in the heat exchanger 4 due to that the first and second heat-transmitting plates 8a and 8b themselves are corroded.

On the other hand, the flow path block 6 is formed to have a rectangular shape with a fluorine resin having a good chemical resistance, and in concrete terms, the same is made of a tetrafluoroethylene-perfluoroalkylvinylether resin (PFA), or a polytetrafluoroethylene resin (PTFE), and is provided with an outer peripheral surface 11 composed of four flat peripheral surface portions 11a and four chamfered corner portions 11b. As is clear from FIG. 4 and FIG. 5, the shallow groove-shaped flow paths 6a and 6b extending in a manner so as to detour partitioning walls 7a and 7b at a center at both of the front and back surfaces of the flow path block 6 are respectively formed. Further, a tube 20A at an inlet side and a tube 20B at an outlet side for the liquid medicine are respectively connected to one of the peripheral surface portions 11a of the outer peripheral surface 11 in the flow path block 6 in a liquid-tight manner. Furthermore, a flow-dividing chamber 6c for supplying the liquid medicine introduced from the tube 20A while dividing the liquid medicine into the flow paths 6a and 6b is formed at the connecting portion of the tube 20A at the inlet side, and an interflow chamber 6d for leading out the liquid medicine from the tube 20B while interflowing the liquid medicine that flows through each of the flow paths 6a and 6b is formed at the connecting portion of the tube 20B at the outlet side.

Moreover, sealing surfaces 13 having a rectangular frame-shape, surrounding peripheries of the flow paths 6a and 6b are formed at both of the front and back surfaces of the flow path block 6, respectively, and mountain-shaped sealing projection portions 6e for securing a sealing characteristic when the first and second heat-transmitting plates 8a and 8b are attached to the sealing surfaces 13, respectively, are integrally formed with the sealing surfaces 13, respectively. The sealing projection portion 6e has a rectangular frame-shape that surrounds the periphery of the flow paths 6a and 6b in a similar manner as that of the sealing surface 13, and is composed of four linear sealing edges 6ea extending along the four peripheral surface portions 11a in parallel and arch-shaped four corner edges 6eb. In addition, the distances of each of the four sealing edges 6ea from each of the peripheral surface portions 11a are equal to each other.

Incidentally, in order to evenly form a collapse of the sealing projection portion 6e at the time of sealing as much as possible in entire sealing projection portion 6e, it is preferable to form each of the corner edges 6eb of the sealing projection portion 6e into a quadrant arch shape.

Further, in the outer peripheral surface 11 of the flow path block 6, concave grooves 6f each having a depth reaching a rear of the sealing projection portion 6e are formed at positions situated nearer both of the front and back surface sides of the flow path block 6 in a manner so as to surround the flow path block 6. A sealing auxiliary member 24, which is formed of a rubber-elastic material having a heat resistance and a chemical resistance, is fitted into the concave groove 6f. A pressurizing force is applied to the sealing projection portion 6e from behind by means of the sealing auxiliary member 24. Furthermore, a sealing portion 22 is composed of the concave groove 6f, the sealing auxiliary member 24, and the sealing projection portion 6e. The depths of the concave grooves 6f are preferable to be equal to each other at the four peripheral surface portions 11a.

The cross-sectional shape of the sealing projection portion 6e may be an arch shape, a rectangular shape, a lip shape, or any other shapes. Furthermore, although only one ridge of the sealing projection portion 6e is provided in the illustrated example, a plurality of ridges of the sealing projection portions 6e may be provided corresponding to the necessity.

Thus, a favorable sealing characteristic between the sealing surface 13 of the flow path block 6 and each of the first and second heat-transmitting plates 8a and 8b is secured by means of fixing the first and second heat-transmitting plates 8a and 8b to the flow path block 6 in a state of pressure-contacting the first and second heat-transmitting plates 8a and 8b with the sealing projection portion 6e. In addition, since the sealing auxiliary member 24 that is formed of the rubber-elastic material is fitted into the concave groove 6f, and the pressurizing force is applied to the sealing projection portion 6e from behind by means of the sealing auxiliary member 24, even when the flow path block 6 has a slight thermal deformation along with a repetition of a cooling operation or a heating operation on the liquid medicine that flows through the flow paths 6a and 6b of the flow path block 6, the thermal deformation of the sealing projection portion 6e is suppressed to the minimum by means of the sealing auxiliary member 24. As a result, the plastic deformation of the sealing projection portion 6e is suppressed and the sealing characteristic is further improved.

Moreover, the radiating plates 14 attached to the outer surface of two of the first and second heat-transmitting plates 8a and 8b of the heat exchanger 4 are that for accelerating the heat release of the thermo-modules 10 by introducing cooling water into an inside flow path through a cooling pipe 12 in the case of, for example, cooling the liquid medicine. As is clear from FIG. 2, FIG. 6, and FIG. 7, the radiating plate 14 has approximately the same size as that of the first and second heat-transmitting plates 8a and 8b, and a plurality of screw insertion holes 19a for inserting a plurality of locking screws 19 are formed in the periphery of the radiating plate 14.

On the other hand, in the periphery of the first and second heat-transmitting plates 8a and 8b, a plurality of screw holes 19b for screwing the locking screws 19 are formed at positions between the screw insertion holes 18a for inserting the coupling screws 18, and the radiating plates 14 are respectively fixed to the first and second heat-transmitting plates 8a and 8b with the thermo-modules 10 therebetween by means of screwing and fastening the locking screws 19 to the screw holes 19b. At this moment, the radiating plates 14 respectively press the thermo-modules 10 toward the first and second heat-transmitting plates 8a and 8b by means of being in close contact with the outer surface of the thermo-modules 10. Thereby, the thermo-modules 10 are respectively sandwiched and fixed between the first and second heat-transmitting plates 8a and 8b and the radiating plates 14. However, the thermo-modules 10 may be respectively attached to the first and second heat-transmitting plates 8a and 8b by means of appropriate attaching method such as a screw fixation or the like.

Incidentally, screw insertion holes 19a similar to that of the radiating plate 14 may be provided instead of providing the screw holes 19b in the first and second heat-transmitting plates 8a and 8b, and the first and second heat-transmitting plates 8a and 8b may be respectively coupled with the radiating plates 14 together by means of screwing and fastening the locking screws 19 inserted into the screw insertion holes 19a of the radiating plates 14, and the first and second heat-transmitting plates 8a and 8b to the nuts disposed at the outer surface of the first and second heat-transmitting plates 8a and 8b.

Further, it is natural that a screw head of each of the coupling screws 18 is constructed not to disturb the radiating plates 14 in the case of that the radiating plates 14 are attached to the first and second heat-transmitting plates 8a and 8b.

The invention claimed is:

1. A temperature control device for liquid medicines, comprising: a flow path block made of a chemical resistant resin, including groove-shaped flow paths through which liquid medicines flow, at both of front and back surfaces thereof; heat-transmitting plates respectively disposed at both of the front and back surfaces of the flow path block so as to face the groove-shaped flow paths; and thermo-modules respectively disposed at outer surfaces of the heat-transmitting plates, and performing a cooling operation or a heating operation on the liquid medicines flowing through the groove-shaped flow paths via the heat-transmitting plates, wherein at least one ridge of a sealing projection portion surrounding a periphery of each of the groove-shaped flow paths is integrally formed with the flow path block by a part of the flow path block at sealing surfaces respectively formed at both of the front and back surfaces of the flow path block, wherein the heat-transmitting plates are fixed to the flow path block in a state of pressure-contacting the sealing projection portions, respectively; and a concave groove having a depth reaching a rear of the sealing projection portion is formed at an outer peripheral surface of the flow path block in a manner so as to surround the flow path block, and a sealing auxiliary member formed of a rubber-elastic material having a heat resistance and a chemical resistance for applying a pressurizing force to the sealing projection portion is fitted into the concave groove; and wherein a normal of the outer peripheral surface is orthogonal to a normal of the front and back surfaces of the flow path block.

2. The temperature control device for liquid medicines according to claim 1, wherein the flow path block is formed to have a rectangular shape, and the outer peripheral surface has four flat peripheral surface portions, and wherein the sealing projection portion is formed to have a rectangular frame shape and is formed to have four linear sealing edges respectively extending along the four peripheral surface portions in parallel, and wherein respective distances of the four linear sealing edges from the peripheral surface portions are equal to each other, and the depths of the concave grooves formed in the four peripheral surface portions are equal to each other.

3. The temperature control device for liquid medicines according to claim 1, wherein radiating plates for accelerating a heat release from the thermo-modules are respectively disposed at the outer surfaces of the heat-transmitting plates disposed at both of the front and back surfaces of the flow path block while being in close contact with the thermo-modules, respectively.

4. The temperature control device for liquid medicines according to claim 1, wherein the heat-transmitting plates are formed to have a larger dimension than a dimension of the flow path block, and wherein the two heat-transmitting plates at both sides of the flow path block are coupled with each other by means of coupling screws intersecting an outside of the flow path block, and wherein the flow path block is sandwiched between the heat-transmitting plates and fixed thereto by means of the two heat-transmitting plates being tightened against each other by means of the coupling screws.

5. The temperature control device for liquid medicines according to claim 4, wherein radiating plates for accelerating a heat release from the thermo-modules are respectively disposed at the outer surfaces of the heat-transmitting plates disposed at both of the front and back surfaces of the flow path block while being in close contact with the thermo-modules, respectively, and wherein the thermo-modules are respectively sandwiched between the radiating plates and the heat-transmitting plates and fixed thereto by means of the radiating plates being respectively fixed to the heat-transmitting plates with locking screws.

6. The temperature control device for liquid medicines according to claim 1, wherein the normal of the outer peripheral surface is orthogonal to a normal of the heat-transmitting plates.

* * * * *